United States Patent [19]

Takeuchi et al.

[11] Patent Number: 4,584,668
[45] Date of Patent: Apr. 22, 1986

[54] MAGNETIC BUBBLE MEMORY DEVICE

[75] Inventors: Teruaki Takeuchi, Kokubunji; Ryo Suzuki, Kodaira; Naoki Kodama; Masatoshi Takeshita, both of Hachioji; Tadashi Ikeda, Kanagawa; Toshihiro Sato, Hachioji; Yutaka Sugita, Tokorozawa, all of Japan

[73] Assignee: Hitachi, Ltd., Tokyo, Japan

[21] Appl. No.: 603,450

[22] Filed: Apr. 24, 1984

[51] Int. Cl.4 .............................. G11C 19/08
[52] U.S. Cl. ...................................... 365/36
[58] Field of Search .................... 365/36, 37

[56] References Cited

U.S. PATENT DOCUMENTS 4,086,572  4/1978  Bullock ............................. 365/36
4,453,231  6/1984  Kodama et al. ................... 365/36
4,503,517  3/1985  Umezaki et al. .................. 365/36

FOREIGN PATENT DOCUMENTS 0082526  6/1983  European Pat. Off. ............ 365/36

OTHER PUBLICATIONS

IBM Journal of Research & Development–Mar. 1976, pp. 132–137.

Primary Examiner—James W. Moffitt
Attorney, Agent, or Firm—Antonelli, Terry & Wands

[57] ABSTRACT

A magnetic bubble memory device has two types of magnetic bubble propagation tracks. One type of magnetic bubble propagation tracks are formed by implanting ions into a magnetic layer. The other are formed by a soft magnetic material, for example, a permalloy. At least the area where the soft magnetic material is located has a smaller thickness than the other area.

11 Claims, 17 Drawing Figures

MAGNETIC BUBBLE MEMORY DEVICE

BACKGROUND OF THE INVENTION

The present invention relates to a magnetic bubble memory device and, more particularly, to a magnetic bubble memory device using both soft magnetic element tracks and ion-implanted tracks in which a bias margin which is common to both tracks is made wide.

The magnetic bubble memory device which has been conventionally practically used is of the type called a permalloy device and its fundamental concept is that a cylindrical magnetic domain, i.e., a bubble 2 which exists on a magnetic garnet film, e.g., on a (YSm-LuCa)$_3$(FeGe)$_5$O$_{12}$ garnet film is transferred along a permalloy track 1 provided on the garnet film as shown in FIG. 1 due to the rotating magnetic field applied in the surface. A bubble generator, a transfer gate, a swap gate, a replicator, etc. consist of the permalloy pattern 1 and a conductor pattern 5 provided between a garnet film 3 and the permalloy pattern 1 through insulating layers 4 and 6 as shown in FIG. 2. Each function is performed by allowing a control pulse current to flow through the conductor pattern 5. (In FIG. 1, a non-magnetic substrate is not shown.)

For a high density and high integration bubble memory device, a pattern width of the permalloy track 1 shown in FIG. 1 and the dimension of the gap between adjacent permalloy elements have been remarkably made fine. For example, when a device of a bit period of 8 $\mu$m is formed and bubbles therein have a diameter of about 2 $\mu$m, it is necessary to set the pattern and gap dimensions to be as fine as about 1 $\mu$m. In the future, to realize a further high density for a device by means of a permalloy device, it is necessary to form a fine permalloy pattern of 1 $\mu$m or less over the whole chip and this method is technically very difficult.

On the contrary, recently, a bubble memory device of a new type is being highlighted. This new device is characterized in that the track is formed by implanting ions in place of a conventional permalloy track and is called an ion implanted device. Namely, as shown in FIG. 3, a mask (not shown) having a shape of a contiguous disk (a bead-like pattern) is formed on the garnet film 3 and ions such as Ne or H$_2$ ions or the like are implanted into the garnet film surface to form an ion implanted region 7 in the portion outside the contiguous disk, and the direction of the magnetization of region 7 is made parallel with the surface of the garnet film 3. In this way, by applying a rotating magnetic field to the surface in parallel thereto, a bubble is transferred along the edge of a contiguous disk 8 (a propagation track) in a similar manner to the permalloy device. A feature of this ion implanted device is that the pattern dimension of the track 8 may be as large as approximately twice that of the track of the permalloy device and since its manufacture is easy, it is fitted to a device of a high density.

However, this ion implanted device has such drawbacks that the operations of the replicator, transfer gate, swap gate, etc. are not sufficiently stable and that there is no block replicator; therefore, this causes a problem when such a device is made fit for practical use.

Therefore, as a magnetic bubble memory device having a replicator, transfer gate, swap gate, etc. which sufficiently stably operate and having bubble tracks of a high density, a magnetic bubble memory device has been proposed in which tracks formed by means of ion implantation and tracks formed by permalloy are both used, thereby making the most of the above-mentioned features of the permalloy and ion-implanted devices. That is, the tracks formed by implanting ions are used as minor loop tracks, while at least a part of the major loop (or line) is formed by permalloy.

A bubble memory device is generally constituted by a minor loop group 9 serving as an information memory section and a major line or major loop serving to write and read information, as shown in FIG. 4. A transfer gate, swap gate, replicator, and the like 11 are used for junctions between the minor loops 9 and the major lines (or major loops). The minor loops 9 are constituted by the bubble propagation tracks and occupy the greater part of the device area. The major lines or loops (hereinafter referred to as merely "major lines" for simplicity sake) comprise: bubble tracks 10 and 12; a bubble generator 13; and a bubble detector 14. The minor loops 9 and the major lines are connected through the transfer gate, swap gate, replicator, and the like. In a device of such a type, the minor loops 9 occupying the greater part of the device area are formed by the ion-implanted tracks which are appropriate for realizing a high density and at least a part of the replicator and/or transfer gate in the major lines is formed by permalloy. The major lines, that is, the replicator, etc. occupy only a small part of the device area. Therefore, formation of these major lines by permalloy is possible, although the pattern dimension is more strictly limited than the ion-implanted tracks in the minor loop group. In addition, it is also possible to constitute the major lines so that the bit period thereof is, for example, two to four times that of the minor loop group. Such an arrangement alleviating the restriction in pattern dimension of the permalloy make the manufacture of the bubble memory device easy.

However, the magnetic bubble memory device which adopts the two kinds of bubble propagation tracks as described above has a problem such that there is a disagreement in bias magnetic field margin between the ion-implanted tracks and the soft magnetic element tracks.

FIG. 5 is a schematic diagram of a cross sectional structure of a magnetic bubble memory device using both soft magnetic element tracks and ion-implanted tracks (hereinafter, simply referred to as a hybrid device). In this structure, the ion-implanted regions 7 are formed in a part of the magnetic garnet film 3 and the soft magnetic element track 1 is formed on other regions through a spacer 15 therebetween.

In a hybrid device with such a structure as shown in FIG. 6, there occurs such a disagreement in the bias magnetic field margin that the bias magnetic field margin 16 of the soft magnetic element tracks is higher than the bias magnetic field margin 17 of the ion-implanted tracks, which causes a problem such that the common bias magnetic field margin is decreased.

SUMMARY OF THE INVENTION

It is an object of the present invention to provide a magnetic bubble memory device using both soft magnetic element tracks and ion-implanted tracks in which the common bias magnetic field margin of the both tracks is enhanced.

As a solution to the above-mentioned problem, it is effective to reduce the bubble collapse field of the magnetic garnet under the soft magnetic element track and- /or increase the bubble collapse field of the ion-implanted tracks. The bubble collapse field means the magnitude of the bias magnetic field when the bubble collapses after a bubble diameter decreased with an increase of the bias magnetic field.

Basically, the present invention has been made on the basis of the inventors' finding that the bubble collapse field can be decreased by reducing the thickness of the magnetic garnet film.

The present invention intends to substantially reduce the thickness of the magnetic garnet film under the soft magnetic element track to solve the above problem. Therefore, it is also included in the scope of the present invention to effect a decrease of the magnetic garnet film thickness by converting a part of the magnetic garnet film to a non-magnetic material region.

DESCRIPTION OF THE PREFERRED EMBODIMENTS

Figure 7A:
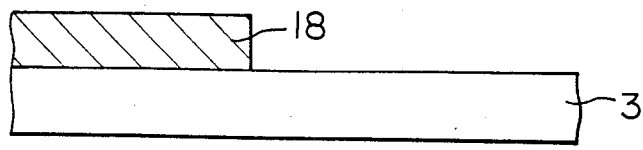
FIGS. 7a–7e illustrate successive stages in the process of manufacturing a magnetic bubble memory device according to one embodiment of the present invention.
Figure 7B:
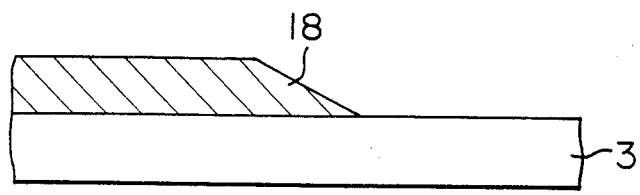
Figure 7C:
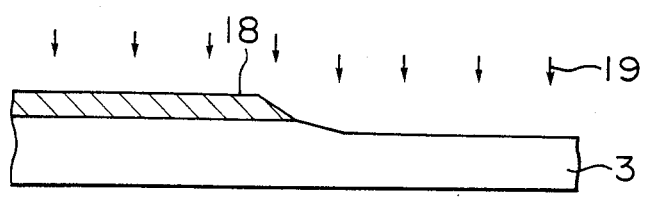

One embodiment of the present invention will be described with reference to FIGS. 7a to 7e. Generally, the magnetic garnet film 3 capable of carrying or holding magnetic bubbles in which the ratio between the film thickness and bubble diameter is approximately 1:1 is used; in this embodiment, the film 3 has a thickness of 1.0 $\mu$m and the bubble diameter is 0.8 $\mu$m. The hybrid device includes two independent kinds of regions: the first kind of regions constitute ion-implanted tracks serving as the information storage section; and the second kind of regions constitute soft magnetic element tracks responsible for readout and writing of the information. The surface of the garnet film 3 in the second regions is planed. Namely, the thickness of the garnet film 3 in the second regions where the soft magnetic element tracks are formed is decreased using the ion milling. More particularly, as shown in FIG. 7a, that region of the magnetic garnet film 3 where an ion-implanted track is to be formed is covered with AZ resist (tradename owned by Hoechst Co., Ltd.) 18 having a thickness of 1 $\mu$m. (Though AZ resist is used here, any other resist material may be used.) Next, the AZ resist 18 is heated so as to thermally cause it to flow as shown in FIG. 7b to obtain a tapered resist edge portion. Then, an ion milling 19 is carried out as shown in FIG. 7c. In dependence upon the presence and absence of the resist 18 and upon the tapered portion, there are produced on the garnet film 3 a non-milled region, a milled region having a reduced film thickness, and a region having a tapered film thickness. The reduction of the film thickness due to the ion milling was set into 8% (0.08 $\mu$m). In the case where there is a sudden change in thickness of the garnet film 3 between the region where the film thickness is reduced due to the ion milling and the region where the film thickness is unchanged because of no milling performed, a new magnetic pole is produced in this boundary portion, so that this causes the transfer of the magnetic bubble to be disturbed due to this magnetic pole. Therefore, to avoid this problem, the gradient of change in thickness of the garnet film 3 is set into 1/100 to 1/5. The gradient larger than 1/5 results in the stopping of magnetic bubbles. In addition, the gradient less than 1/100 causes a problem on the space such that the capacity of the magnetic bubble memory device becomes small. Furthermore, the gradient is preferably set into a range of 1/20 to 1/10. This gradient of the thickness of the film 3 is formed using the characteristic of the AZ resist 18. That is, as shown in FIG. 7b, the film 3 and the resist 18 are heated prior to performance of the ion milling so as to allow the edge portion of the resist 18 to flow, thereby permitting the film thickness of the resist 18 at the edge portion to be gradually changed like a tapered shape as shown in FIG. 7b. Thereafter, as shown in FIG. 7c, the ion milling 19 is carried out.

Then, after the ion milling, the AZ resist 18 is removed and the ion implantation for the purpose of suppressing hard bubbles is executed over the whole surface of the garnet film 3. The ion implanting conditions are 50 keV/Ne$^+$/1$\times$10$^{14}$ cm$^{-2}$.

Figure 7D:
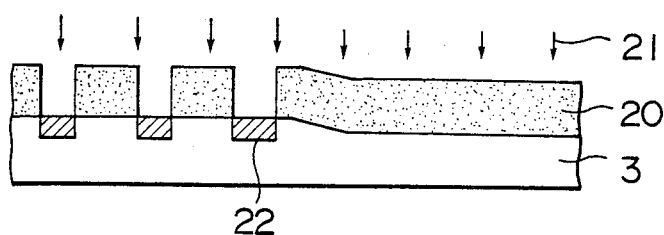

Next, as shown in FIG. 7d, a mask 20 is formed to form ion-implanted tracks and an ion implantation 21 is performed therethrough. This ion implantation is a multi-implantation under conditions of 35 keV/H$_2^+$/1$\times$10$^{16}$ cm$^{-2}$ and 80 keV/H$_2^+$/4.4$\times$10$^{16}$ cm$^{-2}$. In this way, ion-implanted tracks 22 are formed.

Figure 7E:
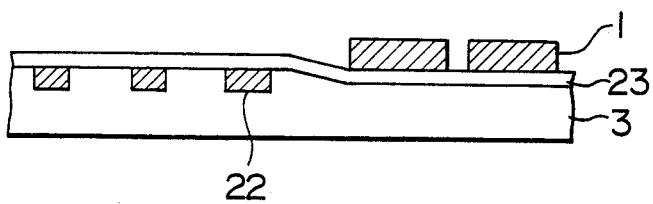

Subsequently, the mask 20 is removed and an SiO$_2$ film 23 serving as a spacer is coated over the whole surface of the garnet film 3 as shown in FIG. 7e, and the annealing is performed at 400° C. for 30 minutes, thereby stabilizing the ion-implanted tracks 22. Finally, soft magnetic element tracks 1 having a thickness of 0.35 $\mu$m is formed on the region over the SiO$_2$ film 23 where the thickness of the garnet film 3 was decreased.

FIGS. 8a to 8e illustrate another embodiment. In the embodiment shown in FIGS. 7a–7e, the thickness of the garnet film 3 has been decreased by physically and mechanically milling it. However, in the embodiment shown in FIGS. 8a–8e, excessive ions are implanted into a predetermined region of the garnet film 3 to change the surface portion of this region to the amorphous and non-magnetic portion, thereby substantially reducing the thickness of a part of the garnet film 3. The process for this purpose will be described hereinbelow.

Figure 8A:
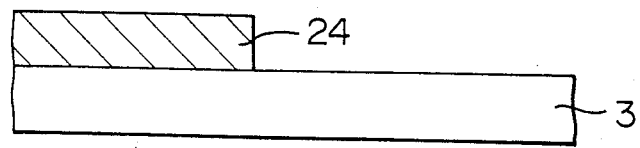
FIGS. 8a–8e illustrate successive stages of the process of manufacturing a magnetic bubble memory device according to another embodiment of the present invention.
Figure 8B:
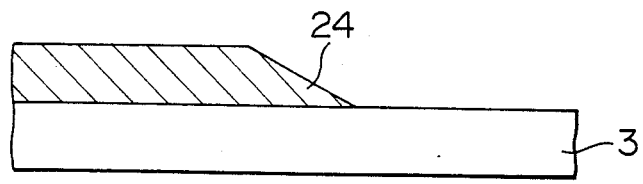
Figure 8C:
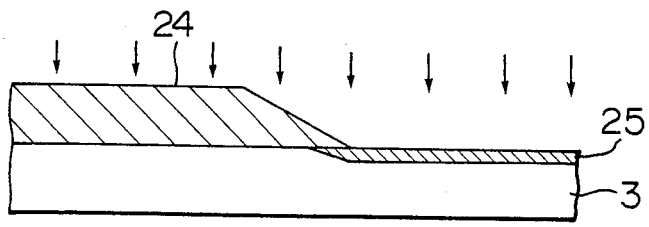
Figure 8D:
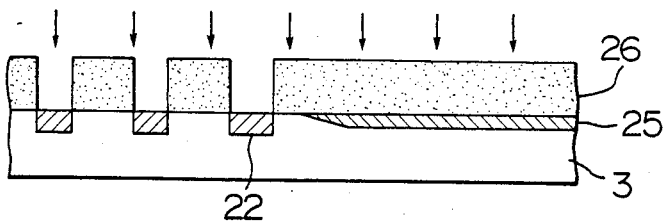
Figure 8E:
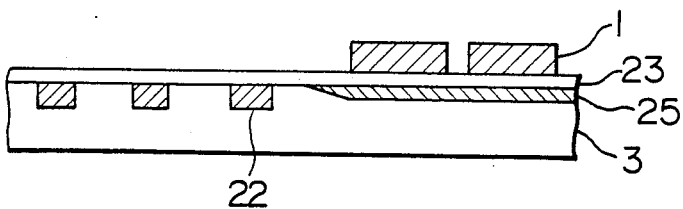

Firstly, a region of the garnet film 3 where the ion-implanted track is to be formed is covered with an AZ resist 24 as shown in FIG. 8a. Then, as shown in FIG. 8b, the film 3 and the resist 24 are heated so as to cause the AZ resist 24 to thermally flow, thereby gradually changing the thickness of the resist film at the resist edge portion. The ion implantation is performed over the whole surface thereon under the conditions of 140 keV/Ne+/4×10$^{15}$ cm$^{-2}$. Due to this, a surface portion 25 of the region where soft magnetic element tracks are to be formed, i.e., of the region that is not covered by the AZ resist 24 is made non-magnetic as shown in FIG. 8c. At the edge portion of the AZ resist 24, the thickness of that portion of the film 3 which is made non-magnetic also changes gradually to be tapered. Due to this, it is possible to obtain such an effect that the thickness of the garnet film 3 is decreased by 0.08 μm in substantially the same manner as in the embodiment shown in FIGS. 7a to 7e.

Next, thereafter, the resist 24 is removed and an ion-implantation mask 26 is formed and a multi-implantation is carried out under the conditions of 50 keV/Ne+/1×10$^{14}$ cm$^{-2}$ and 80 keV/H$_2$+/4.4×10$^{16}$ cm$^{-2}$, thereby forming ion-implanted tracks 22 thereon. Furthermore, after the mask 26 is removed SiO$_2$ is coated on the film 3, and annealing is performed at 400° C. for 30 minutes. Thus, soft magnetic element tracks 1 are formed.

Figure 1:
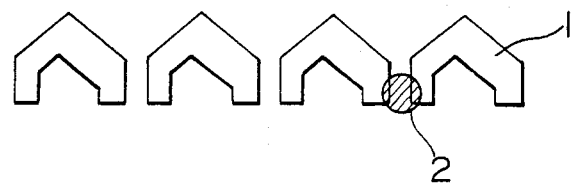
FIG. 1 shows a permalloy track which has been conventionally used.
Figure 2:
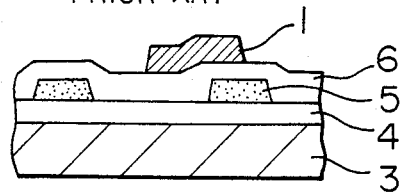
FIG. 2 is a cross sectional view including the permalloy track shown in FIG. 1.
Figure 3:
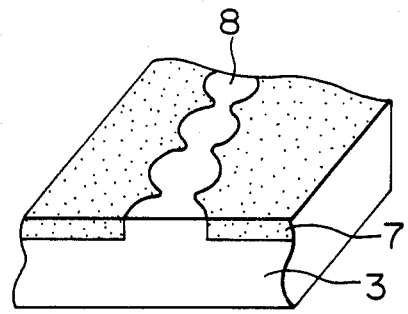
FIG. 3 illustrates a conventional ion-implanted track.
Figure 4:
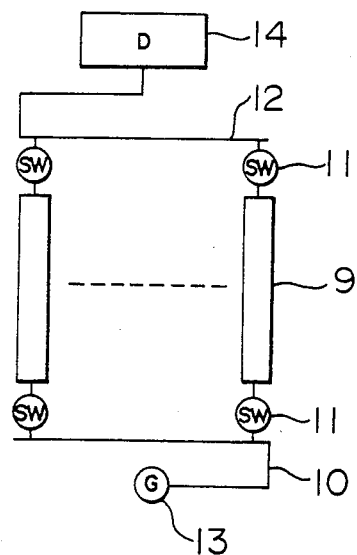
FIG. 4 shows a magnetic bubble memory device which is constituted by a minor loop group and a major lines or loops.
Figure 5:
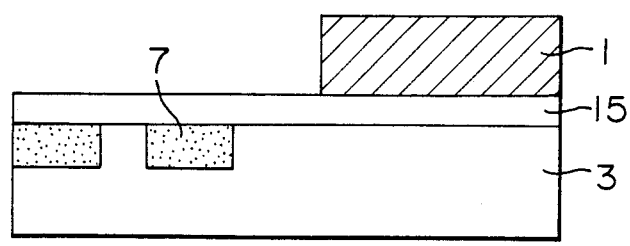
FIG. 5 is a cross sectional view of a hybrid device having permalloy tracks and ion-implanted tracks to which the present invention is applied.
Figure 6:
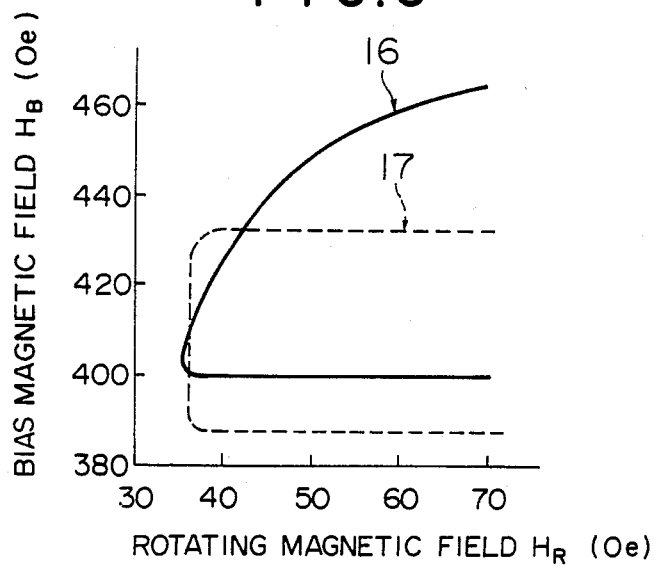
FIG. 6 shows magnitudes of the bias magnetic field margins of both tracks of the hybrid device.
Figure 9:
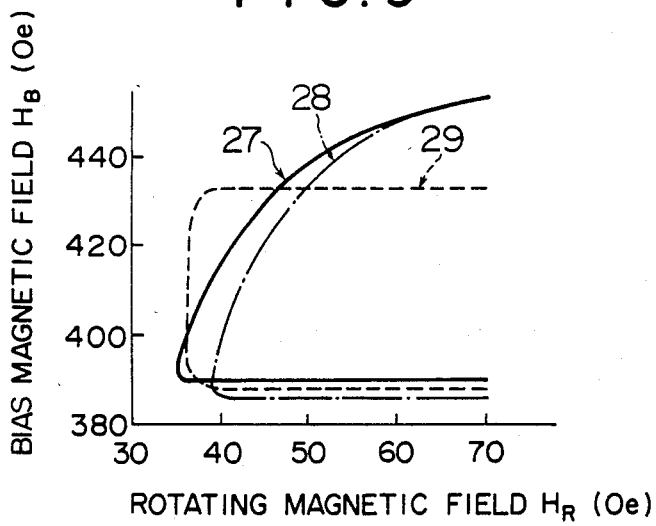
FIG. 9 shows magnitudes of the bias magnetic field margins of a magnetic bubble memory device according to the present invention.

FIG. 9 shows the bias magnetic field margins in the case where the above process is applied. A curve 27 represents the bias magnetic field margin of the soft magnetic element tracks of the device shown in FIG. 7; and a curve 28 represents the bias magnetic field margin of the soft magnetic element tracks of the device shown in FIG. 8. In both cases, the bias magnetic field margin of the soft magnetic element tracks is decreased by about 15 Oe, so that the common region to it and the bias magnetic field margin (curve 29) of the ion-implanted track is increased. Consequently, the common bias magnetic field margin of 10% or more for the rotating magnetic field of not lower than 50 Oe is obtained, resulting in a remarkable improvement over the conventional one.

According to the present invention, in the hybrid device, it is possible to widen the bias margin which is common to the soft magnetic track and ion-implanted track and to obtain the margin of 10% or more even in case of the rotating magnetic field of 50 Oe, i.e., the stable operation can be realized.

We claim:

1. A magnetic bubble memory device comprising first magnetic bubble propagation tracks formed by implanting ions into a magnetic layer for holding magnetic bubbles therein and second magnetic bubble propagation tracks formed by a soft magnetic material, in which the substantial thickness of the area of the magnetic layer at least where the soft magnetic material is located is smaller than that of the other area.

2. A magnetic bubble memory device defined by claim 1, in which the surface of the magnetic layer where the soft magnetic material is located is planed so that the thickness of the area of the magnetic layer at least where the soft magnetic material is located is decreased.

3. A magnetic bubble memory device defined by claim 2, in which the surface of the magnetic layer is planed by an ion-milling.

4. A magnetic bubble memory device defined by claim 1, in which a non-magnetic layer is formed at least in the surface of the magnetic layer at least where the soft magnetic material is located so that the substantial thickness of the magnetic material is decreased.

5. A magnetic bubble memory device comprising first ion-implanted magnetic bubble propagation tracks and second soft magnetic material magnetic bubble propagation tracks, and means for enhancing the common bias magnetic field margin of said first and second magnetic bubble propagation tracks, said common bias magnetic field margin enhancing means including a magnetic layer for holding magnetic bubbles therein and having a first thickness at an area thereof at which said first magnetic bubble propagation tracks are formed by implanting ions into said magnetic layer, and a having a second thickness at an area thereof at which said second magnetic bubble propagation tracks are formed by said soft magnetic material, said second thickness of said magnetic layer at least in the area where said soft magnetic material of said second magnetic bubble propagation tracks is located being smaller than said first thickness of said magnetic layer in the area of said first magnetic bubble propagation tracks.

6. A magnetic bubble memory device defined by claim 5, wherein said magnetic layer in an area between said first and second thickness thereof has a predetermined thickness gradient.

7. A magnetic bubble memory device as defined in claim 6, wherein said predetermined thickness gradient is in the range of 1/100 to 1/5.

8. A magnetic bubble memory device as defined in claim 7, wherein said predetermined thickness gradient is in the range of 1/20 to 1/10.

9. A magnetic bubble memory device defined by claim 5, wherein said common bias magnetic field margin enhancing means includes a non-magnetic layer formed at least in the surface of said magnetic layer at least where said soft magnetic material of said second magnetic bubble propagation tracks is located so that said second thickness of said magnetic material thereat is smaller than said first thickness.

10. A magnetic bubble memory device defined by claim 5, wherein the surface of said magnetic layer where said soft magnetic material of said second magnetic bubble propagation tracks is located is planed so that said second thickness of the area of said magnetic layer at least where said soft magnetic material is located is smaller than said first thickness.

11. A magnetic bubble memory device defined by claim 5, wherein the surface of said magnetic layer is planed by an ion-milling.

* * * * *